United States Patent
Borth et al.

(10) Patent No.: US 11,488,810 B2
(45) Date of Patent: *Nov. 1, 2022

(54) SHOWERHEAD SHROUD

(71) Applicant: Lam Research Corporation, Fremont, CA (US)

(72) Inventors: Andrew Borth, Newberg, OR (US); Christopher Ramsayer, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/643,718

(22) Filed: Dec. 10, 2021

(65) Prior Publication Data

US 2022/0110230 A1 Apr. 7, 2022

Related U.S. Application Data

(63) Continuation of application No. 17/598,433, filed as application No. PCT/US2020/024549 on Mar. 25, 2020.

(Continued)

(51) Int. Cl.
*H05K 9/00* (2006.01)
*H01J 37/32* (2006.01)
(Continued)

(52) U.S. Cl.
CPC .. *H01J 37/32651* (2013.01); *C23C 16/45565* (2013.01); *C23C 16/505* (2013.01);
(Continued)

(58) Field of Classification Search
CPC ............ C23C 16/45565; C23C 16/505; H01J 37/32174; H01J 37/3244; H01J 37/32651;
(Continued)

(56) References Cited

U.S. PATENT DOCUMENTS

| 4,806,703 | A | * | 2/1989 | Sims | .................... H05K 9/0001 |
| | | | | | 174/373 |
| 8,137,467 | B2 | | 3/2012 | Meinhold et al. | |

(Continued)

FOREIGN PATENT DOCUMENTS

| JP | 11312886 A * 11/1999 |
| JP | H11312886 A   11/1999 |

(Continued)

OTHER PUBLICATIONS

International Search Report and Written Opinion of the ISA issued in PCT/US2020/024549, dated Jul. 14, 2020; ISA/KR.

(Continued)

*Primary Examiner* — Jeffrie R Lund
(74) *Attorney, Agent, or Firm* — Weaver Austin Villeneuve & Sampson LLP

(57) ABSTRACT

A processing chamber includes an upper surface and a showerhead arranged to supply gases through the upper surface into the processing chamber. At least a portion of the showerhead extends above the upper surface of the processing chamber. A shroud enclosure is arranged on the upper surface of the processing chamber. The shroud enclosure is arranged around the portion of the showerhead extending above the upper surface of the processing chamber and is configured to isolate radio frequency interference generated by the showerhead.

21 Claims, 5 Drawing Sheets

Related U.S. Application Data

(60) Provisional application No. 62/825,344, filed on Mar. 28, 2019.

(51) Int. Cl.
*C23C 16/505* (2006.01)
*C23C 16/455* (2006.01)

(52) U.S. Cl.
CPC .... *H01J 37/3244* (2013.01); *H01J 37/32899* (2013.01); *H05K 9/0049* (2013.01); *H01J 37/32183* (2013.01); *H01J 2237/0266* (2013.01); *H01J 2237/3321* (2013.01)

(58) Field of Classification Search
CPC .......... H01J 37/32899; H01J 37/32183; H01J 2237/0266; H01J 2237/3321; H05K 9/0049
See application file for complete search history.

(56) References Cited

U.S. PATENT DOCUMENTS

| | | | |
|---|---|---|---|
| 8,673,080 | B2 | 3/2014 | Meinhold et al. |
| 9,476,120 | B2 | 10/2016 | Meinhold et al. |
| 2009/0095218 | A1* | 4/2009 | Meinhold .......... C23C 16/45565 118/712 |
| 2009/0095219 | A1* | 4/2009 | Meinhold .......... C23C 16/45572 118/712 |
| 2009/0095220 | A1* | 4/2009 | Meinhold ........... H01J 37/3244 118/712 |
| 2012/0222815 | A1* | 9/2012 | Sabri ................. C23C 16/45565 239/436 |
| 2013/0186568 | A1* | 7/2013 | Long ........................ H05K 9/00 156/345.48 |
| 2014/0252568 | A1* | 9/2014 | Hwang ................... H01L 21/82 257/659 |
| 2015/0354061 | A1* | 12/2015 | Dhas ................... H01J 37/3244 901/30 |
| 2015/0357161 | A1* | 12/2015 | Augustyniak ..... H01J 37/32752 156/345.48 |
| 2016/0348244 | A1 | 12/2016 | Sabri et al. |
| 2017/0069464 | A1* | 3/2017 | Ye ....................... H01L 21/6831 |
| 2017/0125200 | A1* | 5/2017 | Burkhart ........... H01J 37/32522 |
| 2022/0093372 | A1 | 3/2022 | Borth et al. |

FOREIGN PATENT DOCUMENTS

| | | |
|---|---|---|
| JP | 2002-009460 A | 1/2002 |
| KR | 20090003703 U | 4/2009 |
| KR | 2020090003703 U | 4/2009 |
| KR | 10-2018-0037284 A | 4/2018 |
| KR | 10-2018-0038069 A | 4/2018 |
| KR | 10-2019-0025071 A | 3/2019 |
| WO | WO-2020198267 A1 * | 10/2020 ........ C23C 16/45565 |

OTHER PUBLICATIONS

International Preliminary Report on Patentability dated Sep. 28, 2021 in PCT Application No. PCT/US2020/024549.

International Search Report and Written Opinion dated Jul. 14, 2020, issued in PCT/US2020/024549.

KR Office Action dated Feb. 21, 2022, in Application No. KR10-2021-7034994.

* cited by examiner

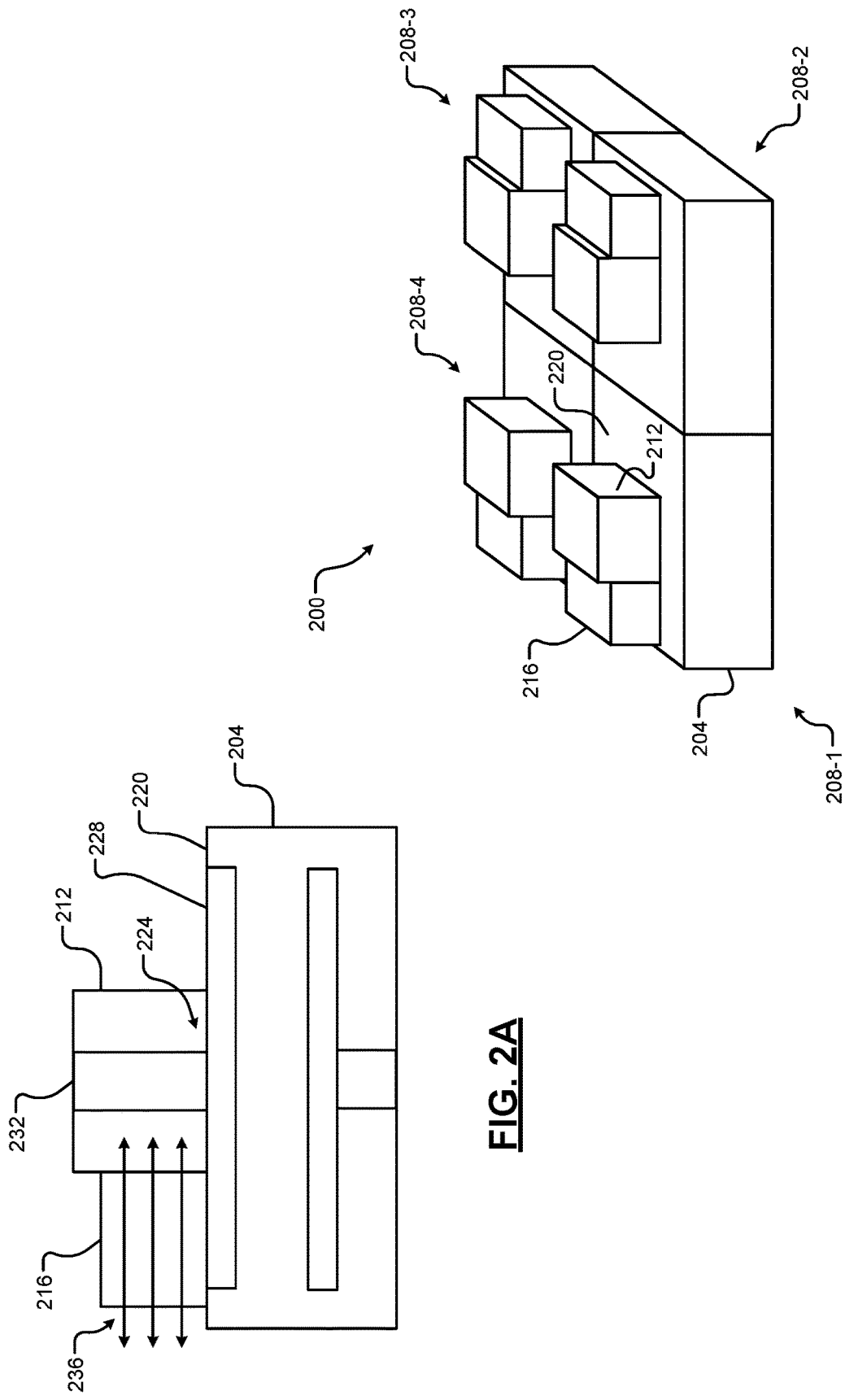

SHOWERHEAD SHROUD

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

FIELD

The present disclosure relates to radio frequency (RF) interference associated with a showerhead in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are used to perform treatments such as deposition and etching of film on substrates such as semiconductor wafers. For example, deposition may be performed to deposit conductive film, dielectric film, or other types of film using chemical vapor deposition (CVD), plasma enhanced CVD (PECVD), atomic layer deposition (ALD), and/or other deposition processes. During deposition, the substrate is arranged on a substrate support and one or more precursor gases may be supplied to a processing chamber during one or more process steps. In a PECVD process, plasma is used to activate chemical reactions within the processing chamber during deposition.

SUMMARY

A processing chamber includes an upper surface and a showerhead arranged to supply gases through the upper surface into the processing chamber. At least a portion of the showerhead extends above the upper surface of the processing chamber. A shroud enclosure is arranged on the upper surface of the processing chamber. The shroud enclosure is arranged around the portion of the showerhead extending above the upper surface of the processing chamber and is configured to isolate radio frequency interference generated by the showerhead.

In other features, the shroud enclosure includes a plurality of sections each corresponding to portions of one or more sides of the shroud enclosure. The plurality of sections includes a bottom section including an opening arranged to receive the portion of the showerhead extending above the upper surface of the processing chamber and lower flange portions extending upward from outer edges of the bottom section. The plurality of sections includes one or more side sections arranged on the bottom section within a perimeter defined by the lower flange portions. The plurality of sections includes a first top section and a second top section arranged on upper edges of the side sections. The first top section and the second top section include upper flange sections extending downward from outer edges of the first top section and the second top section and the upper flange sections overlap the upper edges of the side sections.

In other features, the shroud enclosure includes a plurality of tensioning rods arranged in respective corners of the shroud enclosure within the perimeter defined by the lower flange portions. The plurality of tensioning rods is arranged on posts extending upward from the bottom section. A plurality of knobs is arranged in upper ends of the tensioning rods and the knobs are configured to bias the first top section and the second top section downward. A radio frequency filter module is arranged adjacent to the shroud enclosure. The radio frequency filter module and the shroud enclosure are arranged on the upper surface within an outer perimeter of the processing chamber. The substrate processing system comprises a plurality of the processing chambers and each of the processing chambers includes a respective one of the shroud enclosures.

A shroud enclosure includes a bottom section including an opening arranged to receive a portion of a showerhead extending above an upper surface of a processing chamber and lower flange portions extending upward from outer edges of the bottom section, one or more side sections arranged on the bottom section within a perimeter defined by the lower flange portions, and a first top section and a second top section arranged on upper edges of the side sections. The bottom section, the side sections, the first top section, and the second top section are separable from each other and, when assembled, are configured to isolate radio frequency interference generated by the showerhead.

In other features, the first top section and the second top section include upper flange sections extending downward from outer edges of the first top section and the second top section and the upper flange sections overlap the upper edges of the side sections. The shroud enclosure includes a plurality of tensioning rods arranged in respective corners of the shroud enclosure within the perimeter defined by the lower flange portions. The plurality of tensioning rods is arranged on posts extending upward from the bottom section. A plurality of knobs is arranged in upper ends of the tensioning rods and the knobs are configured to bias the first top section and the second top section downward.

In other features, an assembly includes the shroud enclosure and a radio frequency filter module arranged adjacent to the shroud enclosure. The radio frequency filter module and the shroud enclosure are configured to be arranged on the upper surface within an outer perimeter of the processing chamber. The substrate processing system further includes a plurality of processing chambers and each of the plurality of processing chambers includes a respective one of the shroud enclosures.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 2A and 2B are an example substrate processing system and substrate processing chamber including a shroud enclosure according to the present disclosure;

In the drawings, reference numbers may be reused to identify similar and/or identical elements.

DETAILED DESCRIPTION

Substrate processing systems may include a gas distribution device such as a showerhead. The showerhead is configured to introduce and distributes process gases (e.g., precursor gases, purge gases, etc.). For example, the showerhead may be arranged above a substrate support in a processing chamber and distribute process gases to perform treatments such as deposition and etching on a substrate. In some examples, the showerhead may function as an upper electrode for generating radio frequency (RF) plasma within the processing chamber.

The showerhead may include a base portion (e.g., corresponding to a faceplate and plenum, upper electrode, etc.) that is arranged in an upper surface of and at least partially within the processing chamber. A portion of the showerhead (e.g., a stem portion and/or the base portion) may extend through the upper surface of the processing chamber into a volume above the processing chamber. Systems and methods according to the present disclosure provide a shroud enclosure (e.g., an RF shroud) around the portion of the showerhead extending above the upper surface of the processing chamber. For example, the shroud enclosure is configured to function as a Faraday cage. The shroud enclosure is configured to contain and isolate RF interference generated by the showerhead and related components. Accordingly, RF noise caused by the showerhead and experienced by other components (e.g., components of other processing chambers/stations within the substrate processing system) is mitigated.

In some examples, an RF filter module (e.g., an RF filter box) is arranged above the processing chamber (e.g., on an upper surface of the processing chamber) adjacent to the shroud enclosure. The RF filter module is configured to filter RF noise from electrical signals communicated to and from components within the shroud enclosure.

Figure 1:
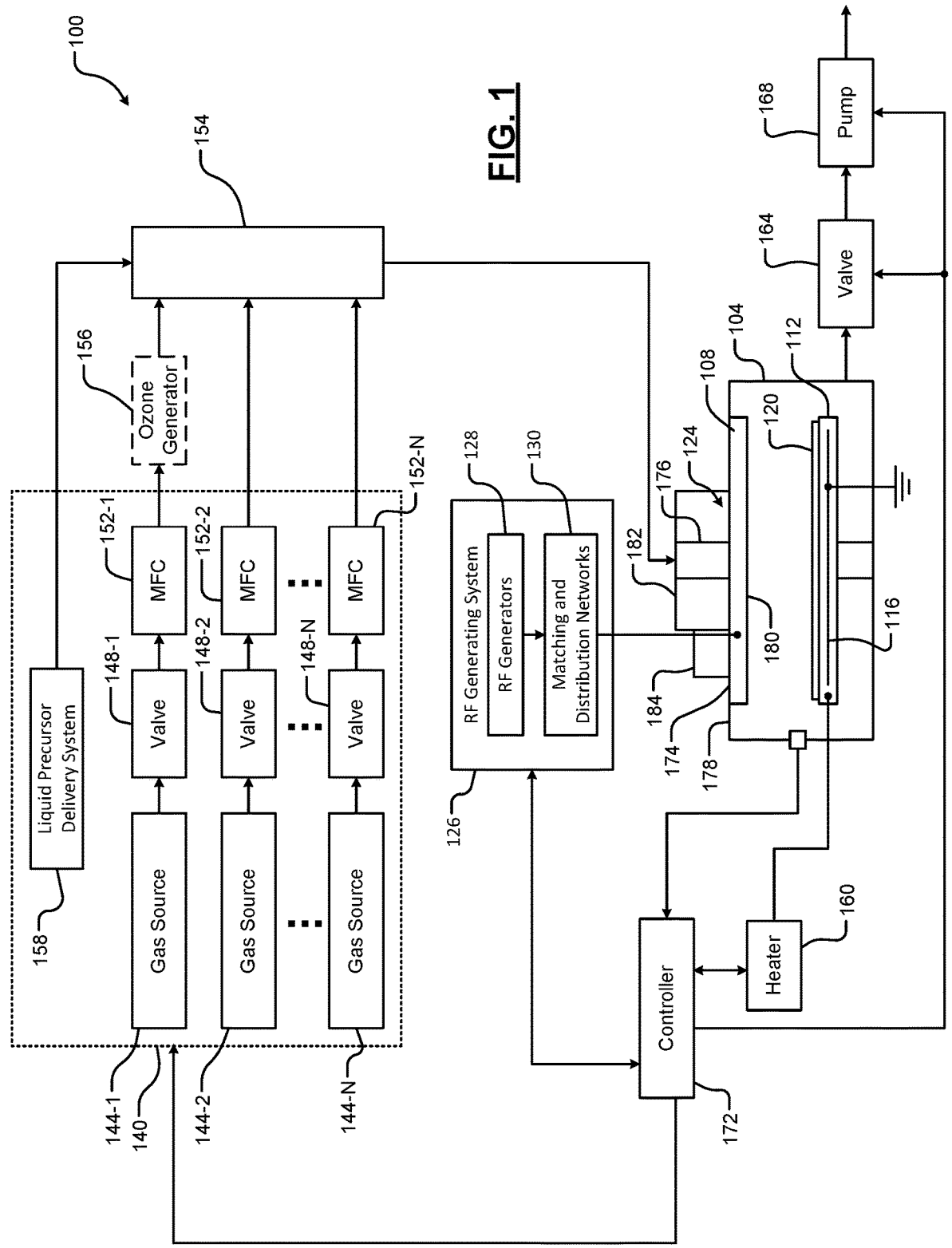
FIG. 1 is a functional block diagram of an example substrate processing system according to the present disclosure.

Referring now to FIG. 1, an example of a substrate processing system 100 according to the principles of the present disclosure is shown. While the foregoing example relates to PECVD systems, other plasma-based substrate processing chambers may be used. The substrate processing system 100 includes a processing chamber 104 that encloses other components of the substrate processing system 100. The substrate processing system 100 includes an upper electrode 108 and a substrate support such as a pedestal 112 including a lower electrode 116. A substrate 120 is arranged on the pedestal 112 between the upper electrode 108 and the lower electrode 116.

For example only, the upper electrode 108 may include a showerhead 124 that introduces and distributes process gases. Alternately, the upper electrode 108 may include a conducting plate and the process gases may be introduced in another manner. The lower electrode 116 may be arranged in a non-conductive pedestal. Alternately, the pedestal 112 may include an electrostatic chuck that includes a conductive plate that acts as the lower electrode 116.

A radio frequency (RF) generating system 126 generates and outputs an RF voltage to one of the upper electrode 108 and the lower electrode 116 when plasma is used. The other one of the upper electrode 108 and the lower electrode 116 may be DC grounded, AC grounded or floating. As shown, the RF voltage is output to the upper electrode 108 and the lower electrode 116 is grounded. For example only, the RF generating system 126 may include one or more RF voltage generators 128 (e.g., a capacitively-coupled plasma RF power generator, a bias RF power generator, and/or other RF power generator) that generate RF voltages, which are fed by one or more matching and distribution networks 130 to the upper electrode 108 (as shown) and/or the lower electrode 116.

An example gas delivery system 140 includes one or more gas sources 144-1, 144-2, . . . , and 144-N (collectively gas sources 144), where N is an integer greater than zero. The gas sources 144 supply one or more gases (e.g., precursors, inert gases, etc.) and mixtures thereof. Vaporized precursor may also be used. At least one of the gas sources 144 may contain gases used in the pre-treatment process of the present disclosure (e.g., $NH_3$, $N_2$, etc.). The gas sources 144 are connected by valves 148-1, 148-2, . . . , and 148-N (collectively valves 148) and mass flow controllers 152-1, 152-2, . . . , and 152-N (collectively mass flow controllers 152) to a manifold 154. An output of the manifold 154 is fed to the processing chamber 104. For example only, the output of the manifold 154 is fed to the showerhead 124. In some examples, an optional ozone generator 156 may be provided between the mass flow controllers 152 and the manifold 154. In some examples, the substrate processing system 100 may include a liquid precursor delivery system 158. The liquid precursor delivery system 158 may be incorporated within the gas delivery system 140 as shown or may be external to the gas delivery system 140. The liquid precursor delivery system 158 is configured to provide precursors that are liquid and/or solid at room temperature via a bubbler, direct liquid injection, vapor draw, etc.

A heater 160 may be connected to a heater coil (not shown) arranged in the pedestal 112 to heat the pedestal 112. The heater 160 may be used to control a temperature of the pedestal 112 and the substrate 120. A valve 164 and pump 168 may be used to evacuate reactants from the processing chamber 104. A controller 172 may be used to control various components of the substrate processing system 100. For example only, the controller 172 may be used to control flow of process, carrier and precursor gases, striking and extinguishing plasma, removal of reactants, monitoring of chamber parameters, etc.

The showerhead 124 according to the present disclosure may include a base portion 174 and a stem portion 176. As shown, the stem portion 176 passes through an upper surface 178 (e.g., through in opening in the upper surface 178) of the processing chamber 104 and the base portion 174 is arranged within the processing chamber 104 adjacent to the upper surface 178. In other examples, the base portion 174 may be arranged at least partially above the upper surface 178 and extend into the processing chamber 104. In still other examples, the base portion 174 may be arranged above the processing chamber 104 and a faceplate 180 of the showerhead 124 may be flush (i.e., coplanar) with the upper surface 179. In each example, at least a portion of the showerhead 124 (e.g., portions of the stem portion 176 and/or the base portion 174) is arranged above the upper surface 178 of the processing chamber 104.

A shroud enclosure (e.g., an RF shroud) 182 is arranged around the portions of the showerhead 124 extending above the upper surface 178 of the processing chamber 104 as described below in more detail. For example, the shroud enclosure 182 is configured to function as a Faraday cage to contain and isolate RF interference generated by the showerhead 124. In some examples, an RF filter module (e.g., an RF filter box) 184 is arranged above the processing chamber 104 adjacent to the shroud enclosure 182 to filter RF noise from electrical signals communicated to and from components within the shroud enclosure 182.

Referring now to FIGS. 2A and 2B, an example substrate processing system 200 may include one or more processing chambers 204 corresponding to respective stations 208-1, 208-2, 208-3, and 208-4, referred to collectively as stations 208. As shown, the substrate processing system 200 includes four of the stations 208 but in other examples fewer or more of the stations 208 may be included. Each of the stations 208 may be configured to perform the same or different processes performed in others of the stations 208. In each of the stations 208, the corresponding processing chamber 204 includes a shroud enclosure 212 and RF filter module 216 according to the present disclosure arranged on a respective upper surface 220 of the processing chamber 204. The shroud enclosure 212 and the RF filter module 216 may be arranged in atmosphere above the processing chamber 204. Further, each shroud enclosure 212 and RF filter module 216 pair may be arranged within an outer perimeter of a respective one of the processing chambers 204. In other words, a footprint of the shroud enclosure 212 may be smaller than a footprint of the processing chamber 204. Relative sizes (e.g., heights, widths, etc.) of the shroud enclosure 212 and the RF filter module 216 are shown for example only and may vary.

Accordingly, each of the shroud enclosures 212 is arranged around components of a showerhead 224 (e.g., including a base portion 228 and stem portion 232) of a respective one of the processing chambers 204. Each of the shroud enclosures 212 contains RF interference generated by the respective showerhead 224 and isolates the RF interference from components of others of the processing chambers 204. In other words, the substrate processing system 200 does not only include a single RF shroud enclosure surrounding all of the processing chambers 204 or stations 208, or multiple large RF shroud enclosures each enclosing an entire one of the processing chambers 204. Rather, each processing chamber 204 and showerhead 224 has a respective shroud enclosure 212 arranged to contain and isolate the RF interference generated by that showerhead 224 and associated components.

The RF filter module 216 is adjacent to and may be optionally connected to the shroud enclosure 212. The RF filter module 216 is configured to filter RF noise from electrical signals (e.g., both AC and DC signals corresponding to RF power, thermocouples, heater control, etc.) 236 communicated to and from components within the shroud enclosure 212. An example RF filter configured to filter RF noise from electrical signals in a substrate processing system is described in more detail in U.S. Patent Publication No. 2017/0125200, which is hereby incorporated herein by reference in its entirety.

Figure 3A:
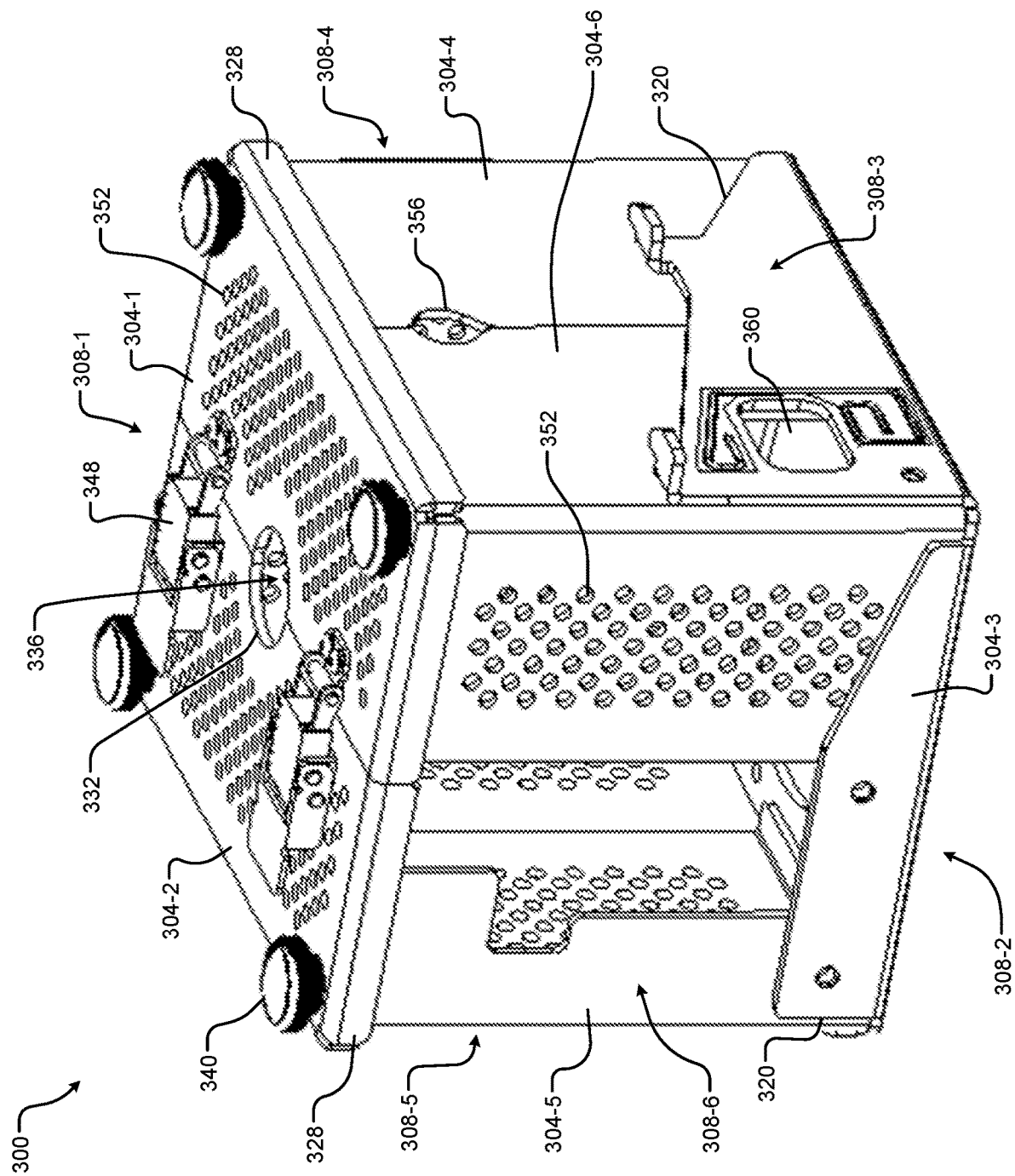
FIGS. 3A and 3B are an example shroud enclosure according to the present disclosure.
Figure 3B:
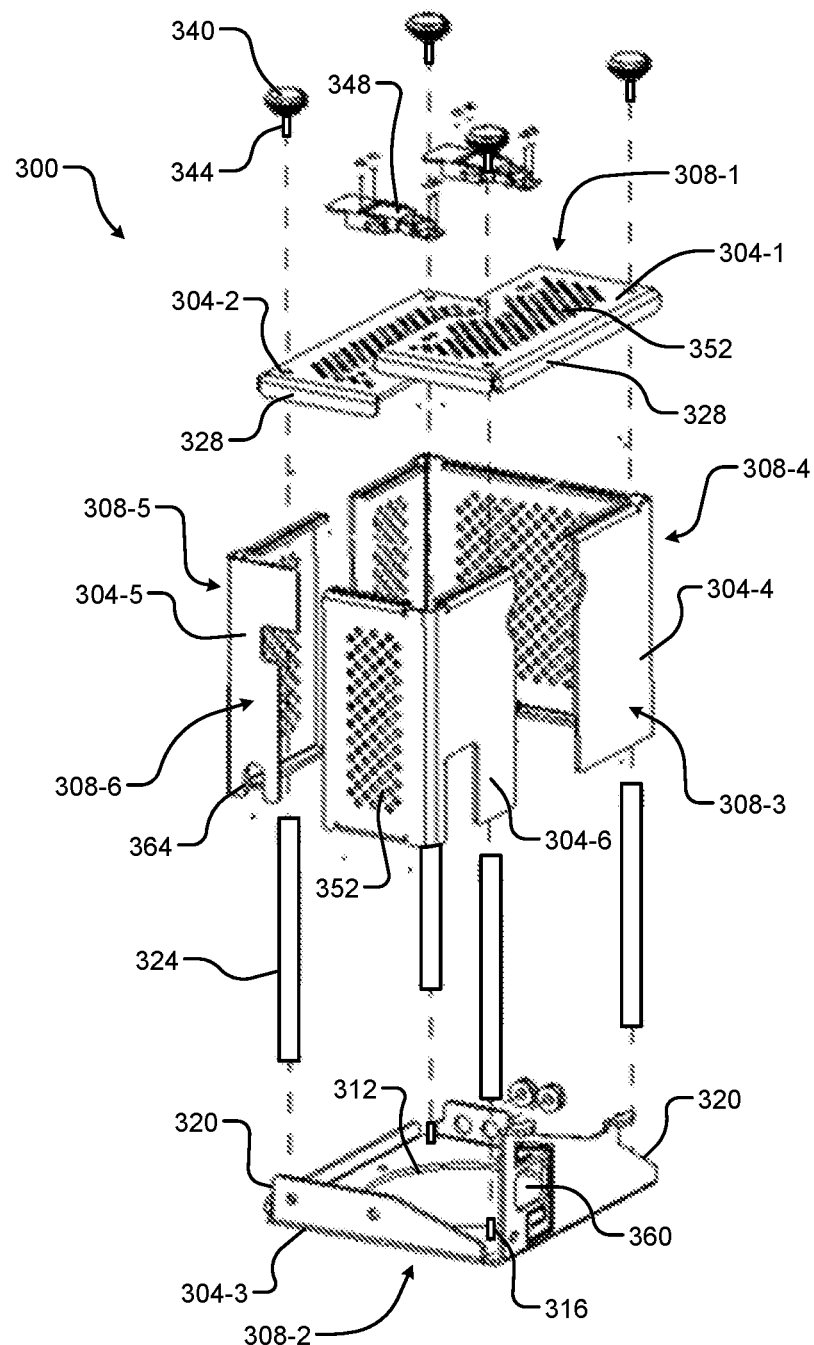

Referring now to FIGS. 3A and 3B, an example shroud enclosure 300 and assembly are shown. The shroud enclosure 300 is configured for toolless assembly and installation. For example, the shroud enclosure 300 includes a plurality of separable sections 304 (individually, sections 304-1, 304-2, 304-3, 304-4, 304-5, and 304-6) that can be manually assembled around an upper portion of the showerhead 224 above the processing chamber 204. For example only, each of the sections 304 comprises sheet metal, such as aluminum. As shown, the shroud enclosure 300 is a generally cubical or rectangular box including a top side 308-1, a bottom side 308-2, and four vertical 308-3, 308-4, 308-5, and 308-6, referred to collectively as sides 308. Further, all of the sections 304 do not respectively correspond directly to one of the sides 308. Rather, each of the sections 304 may comprise one of the sides 308, only a portion of one of the sides 308, and/or portions of multiple ones of the sides 308.

For example, sections 304-1 and 304-2 (e.g., top sections) may form the top side 308-1 and a section 304-3 (e.g., a bottom section) forms the bottom side 308-2 and portions of the sides 308-3 and 308-6. A section 304-4 forms the side 308-4 and portions of the sides 308-3 and 308-5. Section 304-5 forms portions of the sides 308-5 and 308-6 and section 304-6 forms portions of the sides 308-6 and 308-3. Although six of the sections 304 are shown, the shroud enclosure 300 may include fewer or more of the sections 304 in other examples.

An example assembly of the shroud enclosure 300 is shown in FIG. 3B. For example, the section 304-3 may include a central opening 312 configured to receive the stem portion 232 of the showerhead 224 and/or other upper portions of the showerhead 224 arranged to extend through the upper surface 220 of the processing chamber 204.

In some examples, the section 304-3 may be positioned on one or more posts 316 extending upward from the upper surface 220. The sections 304-4, 304-5, and 304-6 may then be positioned on the section 304-3. For example, the sections 304-4, 304-5, and 304-6 are arranged within an outer perimeter of the section 304-3 as defined by flange portions 320 (e.g., lower retaining flange portions) extending upward from each edge of the section 304-3. In this example, the flange portions 320 overlap respective ones of the sections 304-4, 304-5, and 304-6. Further, the posts 316 extend upward within respective corners defined by the sections 304-4, 304-5, and 304-6.

Tensioning rods 324 are arranged on the posts 316 and within the respective corners defined by the sections 304-4, 304-5, and 304-6. In some examples, the posts 316 and lower ends of the tensioning rods 324 are threaded and the tensioning rods 324 are screwed onto the posts 316. With the tensioning rods 324 installed, lower edges of the sections 304-4, 304-5, and 304-6 are retained on the section 304-3 between the flange portions 320 and the tensioning rods 324.

The sections 304-1 and 304-2 (each corresponding to a half, for example, of the top side 308-1) are arranged on upper edges of the sections 304-4, 304-5, and 304-6. For example, the sections 304-1 and 304-2 include flange portions (e.g., upper retaining flange portions) 328 extending downward from each edge of the sections 304-1 and 304-2. In this example, the flange portions 328 overlap respective ones of the sections 304-4, 304-5, and 304-6. Upper edges of the sections 304-4, 304-5, and 304-6 are retained between the flange portions 328 and the tensioning rods 324. The sections 304-1 and 304-2 may each include a respective cutout 332 that together define a central opening 336 in the top side 308-1. For example, the opening 336 may be arranged to receive a conduit for providing one or more gases (e.g., cleaning or purge gases) to the stem portion 232 of the showerhead 224.

A plurality of knobs 340 are arranged to secure the assembly of the shroud enclosure 300. For example, the shroud enclosure 300 includes four of the knobs 340 aligned with the tensioning rods 324 at respective corners of the top side 308-1. The knobs 340 each include respective posts 344 configured to be inserted within upper ends of the tensioning rods 324. For example, the posts 344 and the upper ends of the tensioning rods 324 are threaded and the knobs 340 are screwed into the tensioning rods 324. In this manner, the sections 304-1 and 304-2 are tightened onto the shroud enclosure 300 and the sections 304-4, 304-5, and 304-6 are captured and retained within the sections 304-1, 304-2, and 304-3. In some examples, the top side 308-1 may include one or more latches or clasps 348 arranged to connect the sections 304-1 and 304-2 together. Accordingly, the shroud enclosure 300 may be assembled around and/or removed from the portions of the showerhead 224 above the processing chamber 204.

In some examples, one or more of the sides 308 (e.g., the top side 308-1 and the sides 308-4, 308-5, and 308-6) may be perforated with a plurality of holes 352 to configure the shroud enclosure 300 to function as a Faraday cage. The side 308-3 may correspond to the one of the sides 308 arranged adjacent to (and/or connected to) the RF filter module 216. Accordingly, the side 308-3 may not include the plurality of holes 352. Similarly, the bottom side 308-2 adjacent to the upper surface 220 may not include the plurality of holes 352.

The sections 304 may include additional features associated with operation of the showerhead 224 and the processing chamber 204. For example, the sections 304 may include various openings arranged to receive components for providing gases, electrical signals, etc. to the showerhead 224. For example only, portions of the sections 304-4 and 304-6 corresponding to the side 308-3 may define an opening 356 arranged to receive a conduit for providing process gases to the showerhead 224. The flange portion 320 corresponding to the side 308-3 adjacent to the RF filter module 216 may include one or more openings 360 arranged to receive wiring for providing electrical signals between the RF filter module 216 and the showerhead 224 including, but not limited to, RF signals, heater power signals, thermocouple signals, etc. The section 304-5 may include an opening 364 arranged to receive a conduit for providing cooling gas to the showerhead 224.

Figure 4:
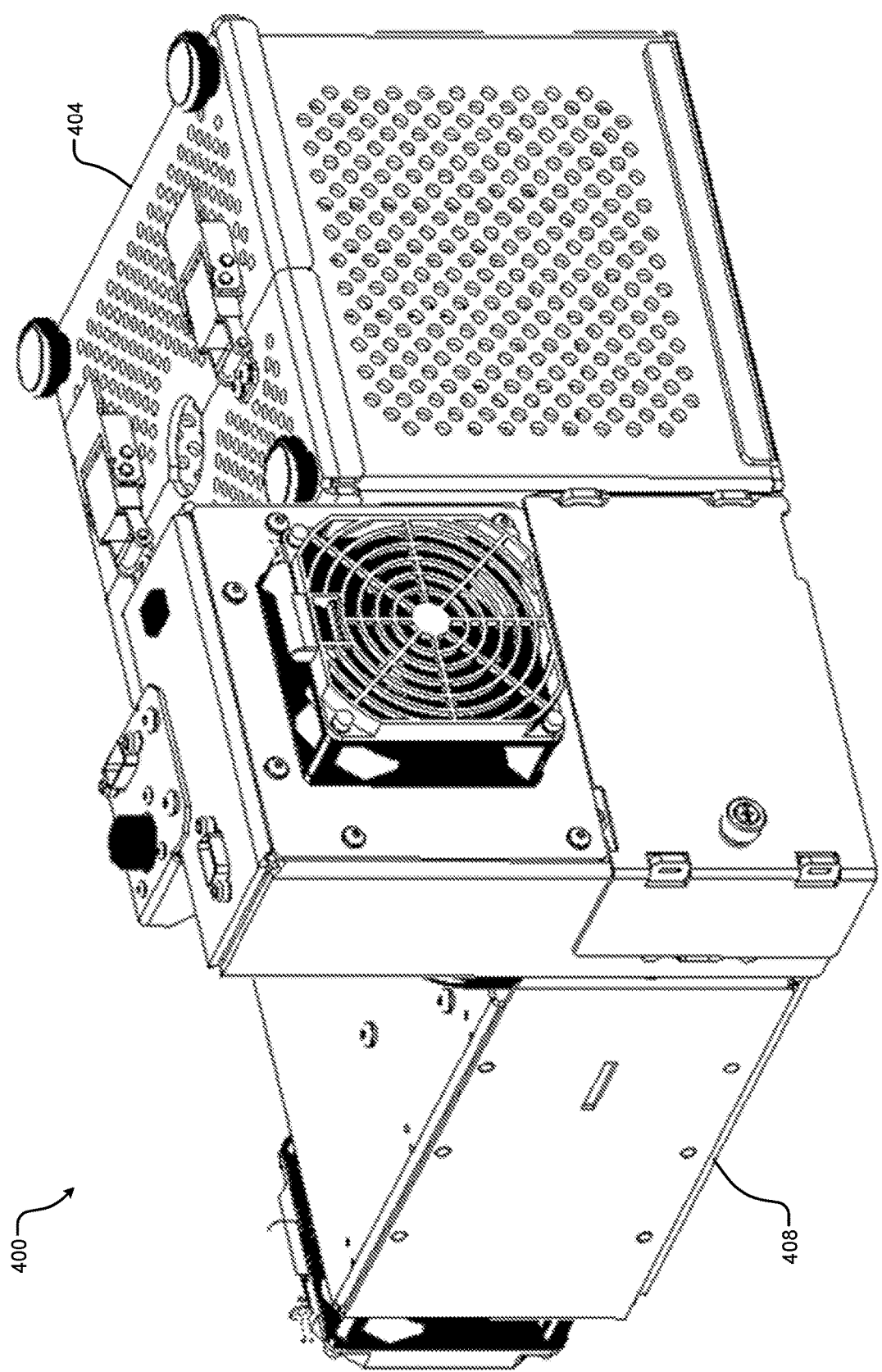
FIG. 4 is an example assembly of a shroud enclosure and RF filter module according to the present disclosure.

FIG. 4 shows one example arrangement of an assembly 400 including a shroud enclosure 404 and RF filter module 408. As shown, The RF filter module 408 is directly adjacent to and may be optionally connected to the shroud enclosure 404. The RF filter module 408 is configured to filter (i.e., remove radiation and conductive noise from) electrical signals communicated into and out of the shroud enclosure 404.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A shroud enclosure, comprising:
a bottom at least partially defined by a bottom section that comprises:
a center through-hole,
a first bottom section flange extending upwards from a first edge,
a second bottom section flange extending upwards from a second edge,
a third bottom section flange extending upwards from a third edge,
a fourth bottom section flange extending upwards from a fourth edge,
four sides at least partially defined by a plurality of side sections, the first bottom section flange, the second bottom section flange, the third bottom section flange, the fourth bottom section flange, or a combination thereof; and
a top at least partially defined by a first top section and a second top section, wherein:
each side section is positioned on the bottom section and within an outer boundary formed by the first bottom section flange, the second bottom section flange, the third bottom section flange, and the fourth bottom section flange,
each bottom section flange partially overlaps with one or more side section,
the first top section is positioned on at least one of the side sections, and
the second top section is positioned on at least another one of the side sections.

2. The shroud enclosure of claim 1, wherein:
a first side section of the plurality of side sections extends at least partially along the first edge and the second edge,
a second side section of the plurality of side sections extends at least partially along the second edge, the third edge, and the fourth edge, and
a third side section of the plurality of side sections extends at least partially along the fourth edge and the first edge.

3. The shroud enclosure of claim 2, wherein:
the first bottom section flange overlaps with the first side section and the third side section,
the second bottom section flange overlaps with the first side section and the second side section,
the third bottom section flange overlaps with the second side section, and
the fourth bottom section flange overlaps with the second side section and the third side section.

4. The shroud enclosure of claim 2, wherein:
the first side section and the third side section are L-shaped, and
the second side section is U-shaped.

5. The shroud enclosure of claim 2, wherein:
a first side of the shroud enclosure is at least partially defined by the first bottom section flange, the first side section, and the third side section,
a second side of the shroud enclosure is at least partially defined by the second bottom section flange, the first side section, and the second side section,
a third side of the shroud enclosure is at least partially defined by the third bottom section flange and the second side section, and
a fourth side of the shroud enclosure is at least partially defined by the fourth bottom section flange, the second side section, and the third side section.

6. The shroud enclosure of claim 2, wherein:
the first top section further includes a first top section flange extending downwards from a first edge of the first top section, a second top section flange extending downwards from a second edge of the first top section, and a third top section flange extending downwards from a third edge of the first top section,
the second top section further includes a fourth top section flange extending downwards from a first edge of the second top section, a fifth top section flange extending downwards from a second edge of the second top section, and a sixth top section flange extending downwards from a third edge of the second top section, and
each top section flange partially overlaps with one or more side sections.

7. The shroud enclosure of claim 6, wherein:
the first top section flange overlaps with the first side section,
the second top section flange overlaps with the first side section and the second side section,
the third top section flange overlaps with the second side section,
the fourth top section flange overlaps with the second side section,
the fifth top section flange overlaps with the second side section and the third side section, and
the sixth top section flange overlaps with the third side section.

8. The shroud enclosure of claim 1, wherein:
one side of the shroud enclosure is defined by a first side section of the plurality of side sections that extends at least partially along the first edge and a second side section of the plurality of side sections that extends at least partially along the first edge, and
the one side includes an opening that is at least partially defined by the first side section and the second side section.

9. The shroud enclosure of claim 8, wherein the first side section the second side section are offset from each other.

10. The shroud enclosure of claim 1, wherein at least two side sections include a plurality of perforations such that at least two sides of the shroud enclosure include the perforations.

11. The shroud enclosure of claim 1, wherein the top of the shroud enclosure includes a center opening at least partially defined by a first edge cutout of the first top section and a second edge cutout of the second top section.

12. The shroud enclosure of claim 1, wherein at the first top section and the second top section each include a plurality of perforations.

13. The shroud enclosure of claim 1, further comprising four tensioning rods, wherein each rod is placed positioned on one corresponding corner of the bottom section.

14. The shroud enclosure of claim 13, further comprising four knobs, wherein each knob is interfaced with one corresponding tensioning rod.

15. An apparatus, comprising:
a processing chamber having a top exterior surface and an internal volume;
a showerhead configured to provide process gases to the internal volume and having an upper portion outside the internal volume and above the top exterior surface of the processing chamber; and
the shroud enclosure of claim 1 positioned on the top exterior surface of the processing chamber and surrounding the upper portion of the showerhead.

16. The apparatus of claim 15, further comprising a radio frequency filter module arranged adjacent to the shroud enclosure.

17. A shroud enclosure, comprising:
a bottom section having a center through-hole, a first bottom section flange extending upwards from a first edge, and a second bottom section flange extending upwards from a second edge;
a first side section having a top end and a bottom end;
a second side section having a top end and a bottom end;
a first top section having a first edge cutout and a first top section flange; and
a second top section having a second edge cutout and a second top section flange, wherein:
the bottom end of the first side section and the bottom end of the second side section are on the bottom section,
the first side section is positioned adjacent to the first bottom section flange such that the first bottom section flange partially overlaps with the first side section,
the second side section is positioned adjacent to the second bottom section flange such that the second bottom section flange partially overlaps with the second side section,
the first top section is positioned on the top end of the first side section,
the first top section flange extends downwards towards the bottom section and partially overlaps with the first side section,
the second top section is positioned on the top end of the second side section,
the second top section flange extends downwards towards the bottom section and partially overlaps with the second side section, and
the first edge cutout and the second edge cutout define a top opening.

18. The shroud enclosure of claim 17, wherein:
the first side section extends partially along the first edge and the second edge, and
the first side section is further positioned adjacent to the second bottom section flange such that the second bottom flange further partially overlaps with the first side section.

19. The shroud enclosure of claim 17, further comprising a third side section having a top end and a bottom end, wherein:
the bottom section further includes a third bottom section flange extending upwards from a third edge,
the bottom end of the third side section is on the bottom section,
the third side section is positioned adjacent to the third bottom section flange such that the third bottom section flange partially overlaps with the third side section, and
the first top section, the second top section, or both the first top section and the first top section are positioned on the third side section.

20. The shroud enclosure of claim 19, wherein:
the bottom section further includes a fourth flange extending upwards from a fourth edge, and
the fourth flange overlaps with one or more of the first side section, the second side section, or the third side section.

21. The shroud enclosure of claim 17, wherein:
the bottom section further includes an outer perimeter formed at least in part by the first bottom section flange and the second bottom section flange, and
the first side section and the second side section are positioned within the outer perimeter.

* * * * *